(12) United States Patent
Choi et al.

(10) Patent No.: US 11,513,573 B2
(45) Date of Patent: Nov. 29, 2022

(54) ACTIVE THERMAL MANAGEMENT OF A DISPLAY PANEL

(71) Applicant: Meta Platforms Technologies, LLC, Menlo Park, CA (US)

(72) Inventors: Min Hyuk Choi, San Jose, CA (US); Zhiming Zhuang, Sammamish, WA (US); Kyung Won Park, Bellevue, WA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 51 days.

(21) Appl. No.: 17/093,423

(22) Filed: Nov. 9, 2020

(65) Prior Publication Data

US 2022/0147124 A1 May 12, 2022

(51) Int. Cl.
| | | |
|---|---|---|
| *G06F 1/20* | (2006.01) | |
| *H01L 51/52* | (2006.01) | |
| *H05K 7/20* | (2006.01) | |
| *G02B 27/01* | (2006.01) | |

(52) U.S. Cl.
CPC .............. *G06F 1/206* (2013.01); *G06F 1/203* (2013.01); *H01L 51/529* (2013.01); *H05K 7/20972* (2013.01); *G02B 27/0176* (2013.01)

(58) Field of Classification Search
CPC ....... G06F 1/206; G06F 1/203; H01L 51/529; H05K 7/20972; G02B 27/0176
See application file for complete search history.

(56) References Cited

U.S. PATENT DOCUMENTS

| | | | | |
|---|---|---|---|---|
| 6,487,865 B1 * | 12/2002 | Luo | ......................... | F25B 21/04 62/3.61 |
| 10,379,583 B2 * | 8/2019 | Allin | ......................... | G06F 1/20 |
| 2004/0036834 A1 | 2/2004 | Ohnishi et al. | | |
| 2004/0212554 A1 * | 10/2004 | Kim | ......................... | H05K 7/20 345/41 |

(Continued)

FOREIGN PATENT DOCUMENTS

| | | | | | |
|---|---|---|---|---|---|
| CN | 109168302 A | * | 1/2019 | ............. | H01L 23/38 |
| CN | 113448090 A | * | 9/2021 | ........... | G02B 27/017 |

OTHER PUBLICATIONS

International Search Report and Written Opinion for International Application No. PCT/US2021/055827, dated Jan. 13, 2021, 11 pages.

*Primary Examiner* — Michael A Matey
(74) *Attorney, Agent, or Firm* — Weaver Austin Villeneuve & Sampson LLP

(57) ABSTRACT

A system includes a display panel, a temperature sensor configured to measure a temperature of the display panel, a thermoelectric device coupled to the display panel and configured to transfer heat to or from the display panel, and a controller electrically coupled to the temperature sensor and the thermoelectric device. The controller is configured to receive the measured temperature of the display panel and, based on the measured temperature of the display panel, send a second signal to the thermoelectric device to cause the thermoelectric device to remove a first quantity of heat from the display panel or send a third signal to the thermoelectric device to cause the thermoelectric device to provide a second quantity of heat to the display panel.

20 Claims, 13 Drawing Sheets

(56) References Cited

U.S. PATENT DOCUMENTS

| | | | |
|---|---|---|---|
| 2007/0221943 A1* | 9/2007 | Moriya | G02F 1/133603 257/686 |
| 2013/0172965 A1* | 7/2013 | Yu | A61N 5/0622 607/100 |
| 2016/0004085 A1* | 1/2016 | Stroetmann | G02B 27/0093 345/8 |
| 2016/0150683 A1* | 5/2016 | Sagerian | H05K 7/20963 62/3.3 |
| 2016/0212889 A1* | 7/2016 | Nikkhoo | G06F 1/163 |
| 2016/0255748 A1* | 9/2016 | Kim | G02B 27/017 361/695 |
| 2016/0363483 A1* | 12/2016 | Tzvieli | G01J 5/12 |
| 2016/0367173 A1* | 12/2016 | Dalvi | A61B 5/0075 |
| 2017/0184863 A1* | 6/2017 | Balachandreswaran | G02B 27/0176 |
| 2018/0095534 A1* | 4/2018 | Omote | G02B 27/017 |
| 2018/0196485 A1* | 7/2018 | Cheng | G06F 1/206 |
| 2018/0198186 A1* | 7/2018 | Hwang | H01F 27/366 |
| 2019/0075689 A1* | 3/2019 | Selvakumar | H05K 7/20136 |
| 2019/0107870 A1* | 4/2019 | Ali | G06F 1/203 |
| 2020/0359886 A1* | 11/2020 | Azar | G02B 27/0172 |
| 2022/0046228 A1* | 2/2022 | Haskin | H04N 17/004 |

* cited by examiner

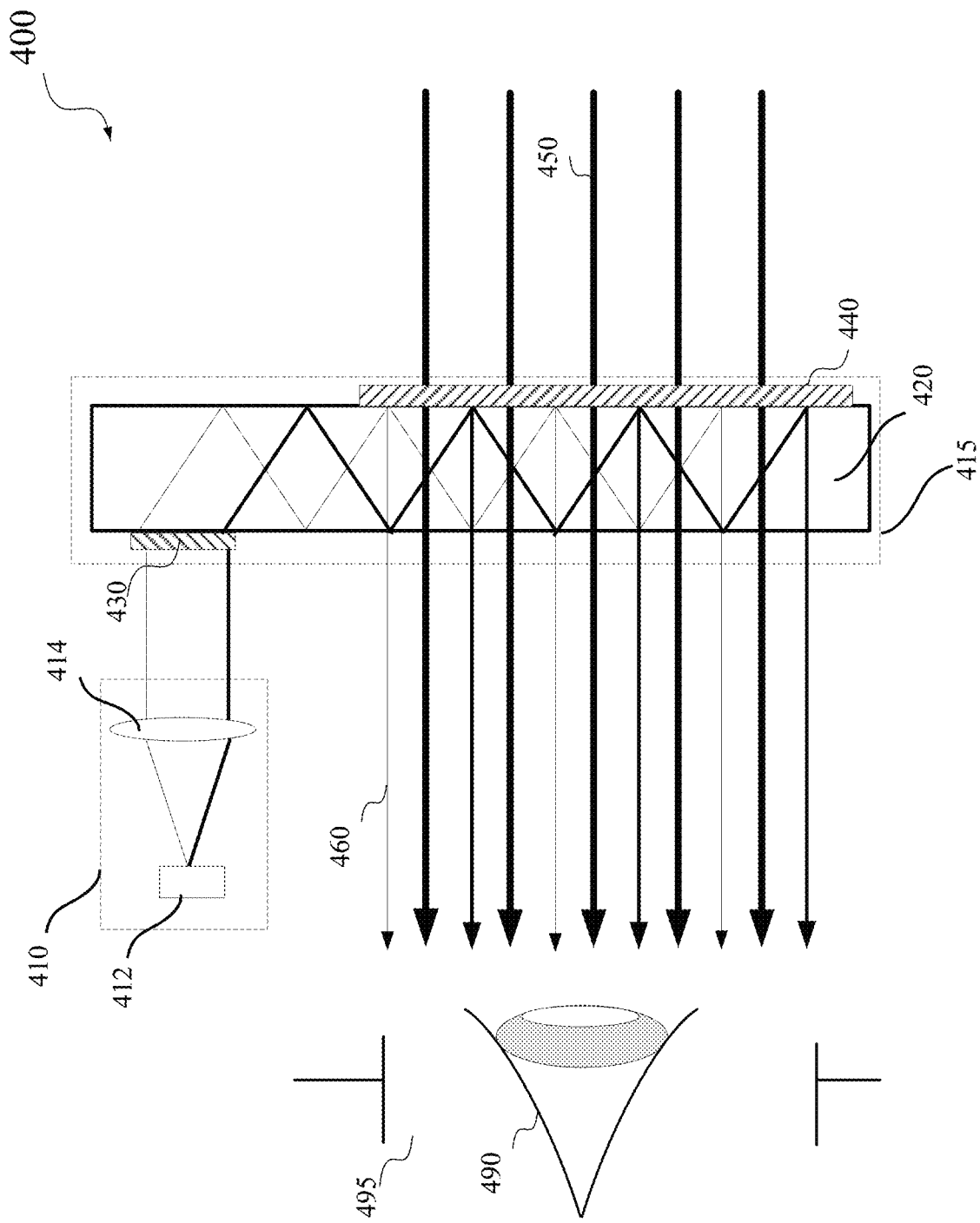

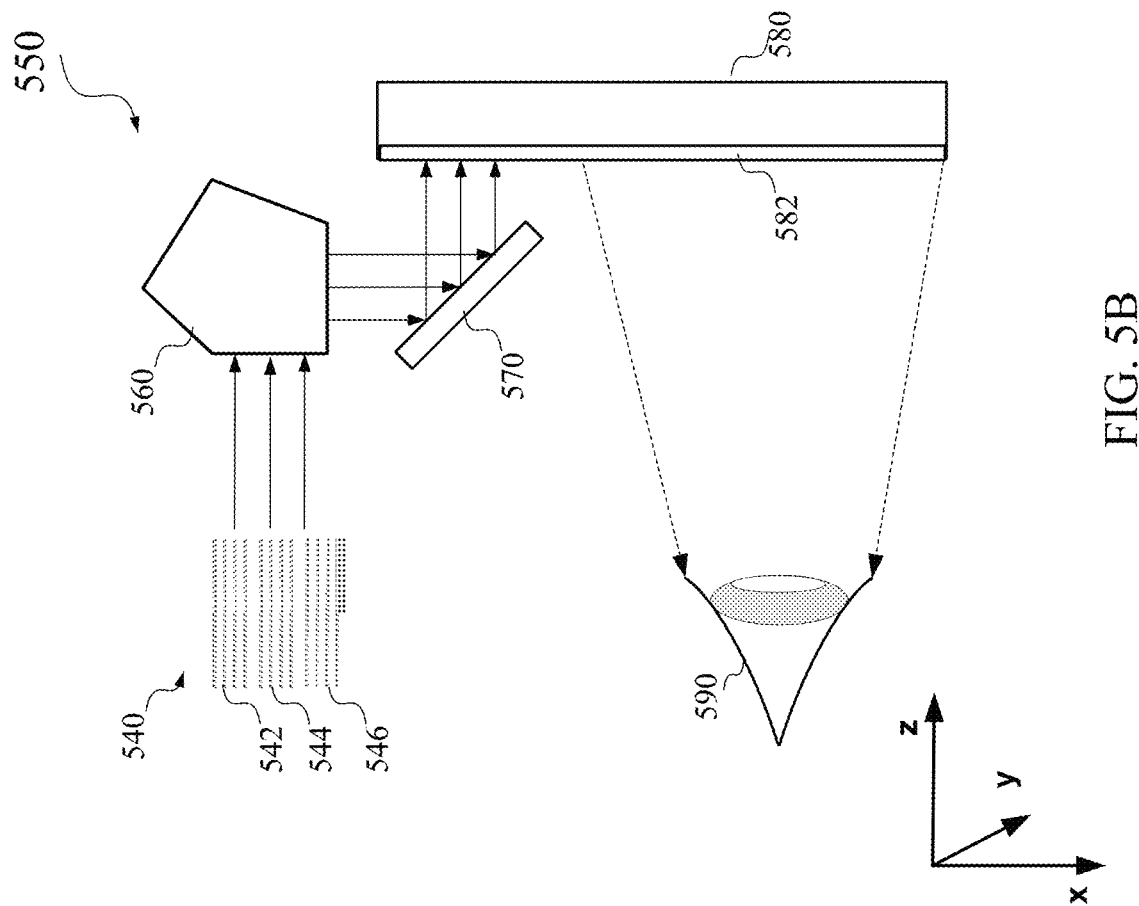
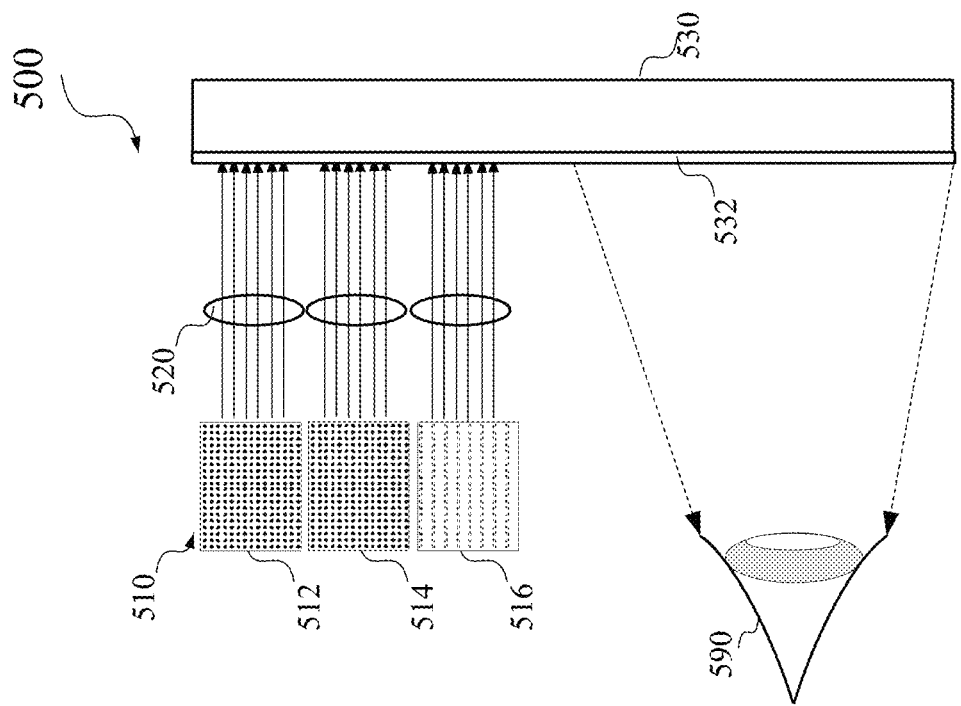
FIG. 5B
FIG. 5A

| | | Temp. 0 °C | Temp. 25 °C | Temp. 35 °C |
|---|---|---|---|---|
| 10V | Max Luminace | 15,000nit | 19,000nit | 20,500nit |
| | EL Power (#1) | 860mW (10,000nit@339mA/cm²) | 860mW (10,000nit@339mA/cm²) | 860mW (10,000nit@339mA/cm²) |
| 9V | Max Luminace | 11,500nit | 15,000nit | 16,900nit |
| | EL Power (#1) | 770mW (10,000nit@339mA/cm²) | 770mW (10,000nit@339mA/cm²) | 770mW (10,000nit@339mA/cm²) |
| 8V | Max Luminace | 7,900nit | 11,000nit | 13,100nit |
| | EL Power (#1) | 620mW (7,900nit@270mA/cm², 10%duty → 13%duty) | 690mW (10,000nit@339mA/cm²) | 690mW (10,000nit@339mA/cm²) |
| 7V | Max Luminace | 4,200nit | 7,600nit | 9,300nit |
| | EL Power (#1) | 596mW (4,200nit@140mA/cm², 10%duty → 24%duty) | 600mW (7,600nit@260mA/cm², 10%duty → 13%duty) | 600mW (9,300nit@320mA/cm², 10%duty → 11%duty) |
| 5V | Max Luminace | 790nit | 1,500nit | 1,900nit |
| | EL Power (#1) | - mW (790nit@27mA/cm²) | 430mW (1,500nit@51mA/cm², 10%duty → 67%duty) | 428mW (1,900nit@63mA/cm², 10%duty → 54%duty) |

FIG. 7

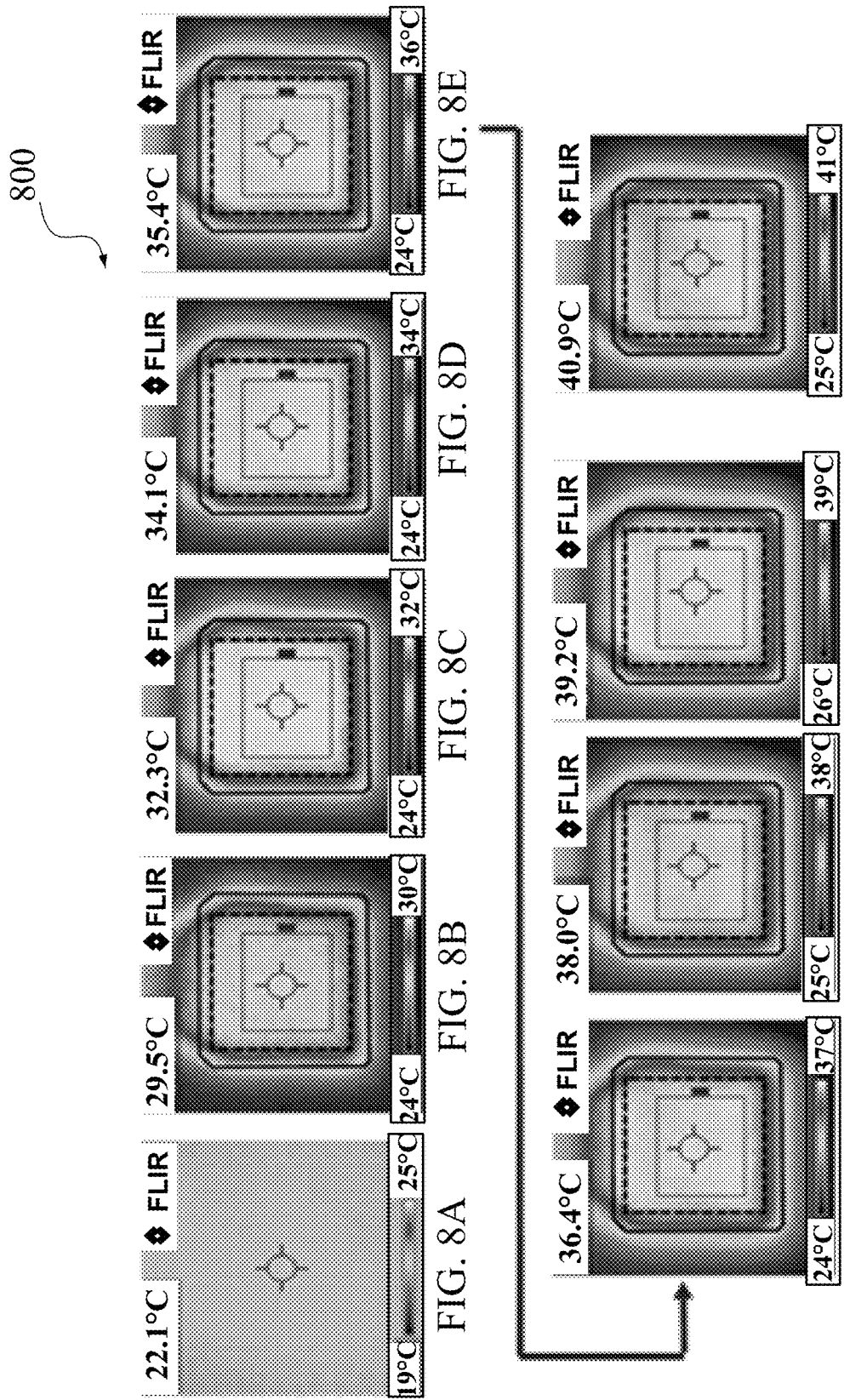

ACTIVE THERMAL MANAGEMENT OF A DISPLAY PANEL

BACKGROUND

An artificial reality system, such as a head-mounted display (HMD) or heads-up display (HUD) system, generally includes a near-eye display system in the form of a headset or a pair of glasses and is configured to present content to a user via an electronic or optic display within, for example, about 10-20 mm in front of the user's eyes. The near-eye display system may display virtual objects or combine images of real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). The computer-generated images or the displayed images may be produced by light sources that are driven to output light having various luminance values.

SUMMARY

This disclosure relates generally to light emitting diode (LED) display systems. More specifically, disclosed herein are techniques for controlling the operating temperatures of micro organic light emitting diodes (μOLEDs) in a μOLED display system. According to certain embodiments, a system may include a display panel, a temperature sensor configured to measure a temperature of the display panel, a thermoelectric device coupled to the display panel and configured to transfer heat to or from the display panel, and a controller electrically coupled to the temperature sensor and the thermoelectric device. The controller may be configured to receive a first signal including the temperature of the display panel measured by the temperature sensor, compare the temperature of the display panel with a target temperature, and send a second signal to the thermoelectric device to cause the thermoelectric device to remove a first quantity of heat from the display panel upon determining that the temperature of the display panel is greater than the target temperature or send a third signal to the thermoelectric device to cause the thermoelectric device to provide a second quantity of heat to the display panel upon determining that the temperature of the display panel is lower than the target temperature.

In some embodiments of the system, the thermoelectric device may include a Peltier heat pump. The second signal and the third signal may be direct current signals having opposite current flow directions. In some embodiments, the thermoelectric device may include a heater and a cooler. The system may also include a heat sink coupled to the thermoelectric device, the heat sink including a thermal conductive material and configured to dissipate heat to or absorb heat from ambient air. In some embodiments, the heat sink may be a back portion of an eye cup.

In some embodiments of the system, the controller may be configured to determine the first quantity of heat based on a first difference between the temperature of the display panel and the target temperature upon determining that the temperature of the display panel is greater than the target temperature, or to determine the second quantity of heat based on a second difference between the temperature of the display panel and the target temperature upon determining that the temperature of the display panel is lower than the target temperature. The controller may be configured to maintain the temperature of the display panel within ±5% of the target temperature in a proportional integral derivative (PID) control loop.

In some embodiments of the system, the temperature sensor may be embedded within the display panel. The target temperature may include a range of temperatures, such as between about 35° C. and about 40° V. The display panel may include a silicon substrate. The thermoelectric device may be characterized by an area that is a fraction of an area of the display panel. The display panel may include a plurality of organic light emitting diodes (OLEDs). The display panel may include an active matrix organic light emitting diode (AMOLED) display.

According to some embodiments, a method may include receiving a first signal comprising a measured temperature of a display panel, comparing the measured temperature of the display panel with a target temperature, and controlling a thermoelectric device coupled to the display panel based on the comparison. The controlling may include sending a second signal to the thermoelectric device to remove a first quantity of heat from the display panel upon determining that the measured temperature of the display panel is greater than the target temperature, and sending a third signal to the thermoelectric device to provide a second quantity of heat to the display panel upon determining that the measured temperature of the display panel is lower than the target temperature.

In some embodiments, the method may also include determining the first quantity of heat based on a first difference between the measured temperature of the display panel and the target temperature upon determining that the measured temperature of the display panel is greater than the target temperature, and determining the second quantity of heat based on a second difference between the measured temperature of the display panel and the target temperature upon determining that the measured temperature of the display panel is lower than the target temperature. In some embodiments, the method may include repeatedly performing the receiving, the comparing, and the controlling in a PID control loop to maintain the measured temperature of the display panel within about ±5% of the target temperature. The temperature of the display panel may be measured by a temperature sensor embedded within the display panel. The thermoelectric device may include a Peltier heat pump, and the second signal and the third signal may be direct current signals having opposite current flow directions.

According to certain embodiments, a computer-program product tangibly embodied in a non-transitory machine-readable storage medium may include instructions configured to cause one or more data processors to perform actions including receiving a first signal comprising a measured temperature of a display panel, comparing the measured temperature of the display panel with a target temperature, and controlling a thermoelectric device coupled to the display panel based in the comparison. The controlling may include sending, upon determining that the measured temperature of the display panel is greater than the target temperature, a second signal to the thermoelectric device to remove a first quantity of heat from the display panel; and sending, upon determining that the measured temperature of the display panel is lower than the target temperature, a third signal to the thermoelectric device to provide a second quantity of heat to the display panel.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 4 illustrates an example of an optical see-through augmented reality system including a waveguide display according to certain embodiments.

FIG. 5A illustrates an example of a near-eye display device including a waveguide display according to certain embodiments.

FIG. 5B illustrates an example of a near-eye display device including a waveguide display according to certain embodiments.

FIG. 7 illustrates the luminance of light sources in an example of a display panel as a function of the driving voltage and operating temperature.

FIGS. 8A-8I illustrate a series of images showing the temperature of an example of a display panel as a function of time.

Figure 1:
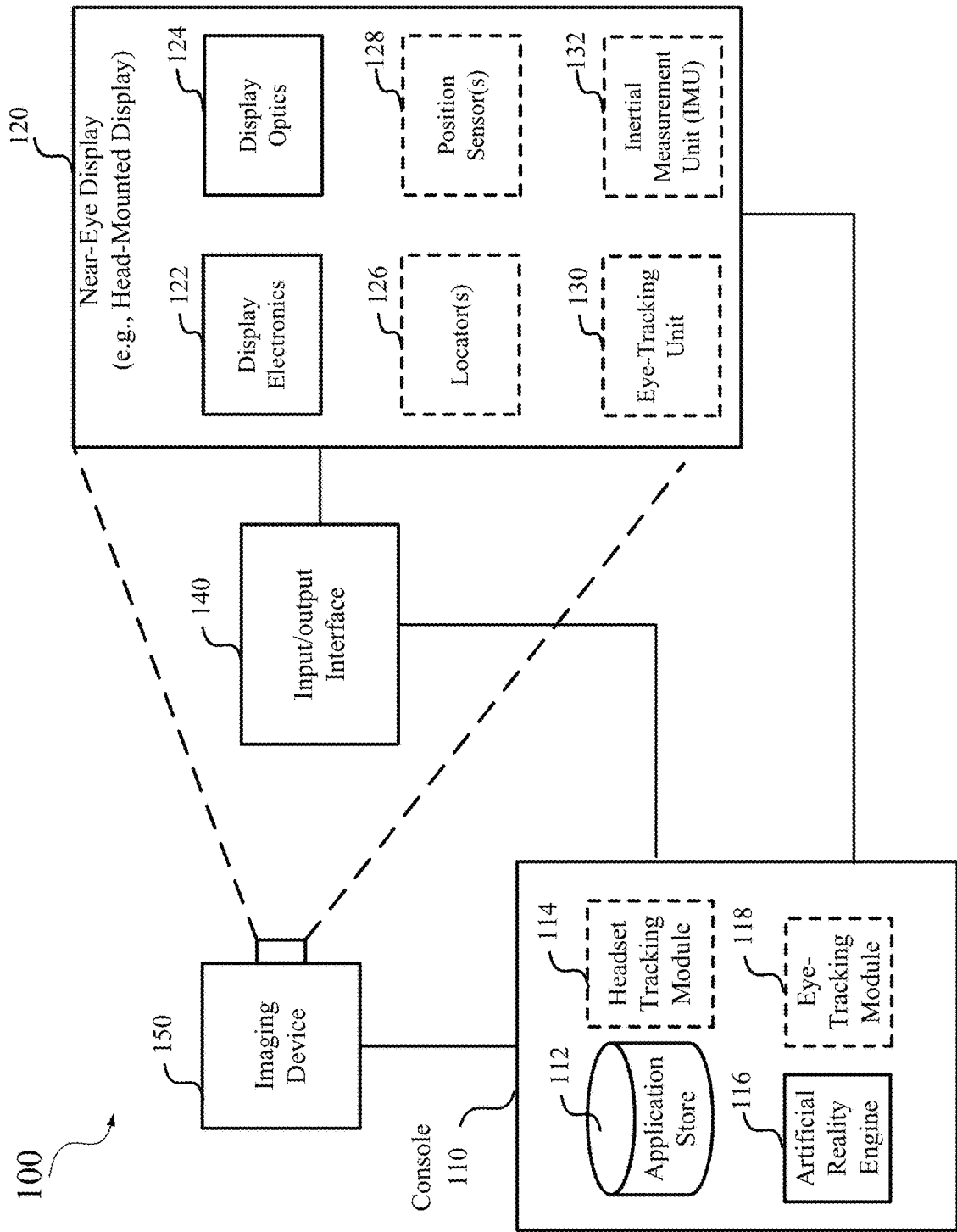
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Techniques disclosed herein relate generally to light emitting diode (LED) display systems. More specifically, disclosed herein are techniques for controlling the operating temperatures of micro organic light emitting diodes (µOLEDs) in a µOLED display system. Various inventive embodiments are described herein, including devices, systems, methods, materials, and the like.

The luminance from some light sources, such as various types of LEDs, may be sensitive to the operating temperature. For example, the luminance from an LED may increase as a function of temperature in a certain temperature range. In one example, if the temperature of an organic LED increases from 25° C. to 35° C., the luminance of the organic LED may increase by approximately 20% at the same driving current. This may be problematic for an LED display panel in a display system (e.g., an AR/VR system) because changes in the temperature of the display panel may cause the luminance to vary, which may result in a decrease in the quality of the displayed image and the user experience. For example, the temperature of the display panel may increase while the light sources are being driven, and the increase may be more significant when a complicated application or content is being produced. Conversely, the temperature of the display panel may decrease if there is a break in the display or if a simpler application or content is being produced.

Accordingly, certain embodiments of the present invention maintain the display panel at an approximately constant temperature by heating and/or cooling the display panel using a temperature control system during operation of the display panel, such that the luminance of the light sources (e.g., LEDs or µOLEDs) in the display panel may be at the desired levels. For example, if the temperature of the display panel exceeds an upper threshold temperature, the temperature control system may function as a cooler to remove heat from the display panel and lower the temperature of the display panel. If the temperature of the display panel falls below a lower threshold temperature, the temperature control system may function as a heater to provide heat to the display panel and increase the temperature of the display panel. The temperature of the display panel may be monitored by a sensor that is embedded in the display panel. The temperature control system may include a controller and a thermoelectric heater/cooler, such as a Peltier heat pump, which may transfer heat in a desired direction that may be determined by the direction of the drive current. In some embodiments, the temperature control system may include a heater and a cooler.

By maintaining the display panel at an approximately constant temperature, the luminance of the light sources within the display panel may be at desired levels during operation to improve user experience. Maintaining the light sources in the display panel at a desired temperature (or temperature range) may also optimize the efficiency of the light sources and reduce the power consumption of the display panel, and may also increase the lifetime of the display panel.

As used herein, the term "organic light emitting diode" or "OLED" refers to a light emitting diode having an emissive electroluminescent layer that includes an organic compound that emits light in response to an electric current. The emissive layer may be arranged between an anode and a cathode. The organic compound may include small molecules or polymers.

As used herein, the term "active matrix organic light emitting diode" or "AMOLED" display refers to a display that uses a thin-film transistor backplane to directly control each individual pixel. An AMOLED display does not use a backlight, because each individual OLED is self-emissive. The amount of luminance provided by each OLED may depend on the current provided to the OLED and the temperature of the display panel.

As used herein, the term "micro-LED" or "µLED" refers to an LED that has a chip where a linear dimension of the chip is less than about 200 µm, such as less than 100 µm, less than 50 µm, less than 20 µm, less than 10 µm, or smaller. For example, the linear dimension of a micro-LED may be as small as 6 µm, 5 µm, 4 µm, 2 µm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (µLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
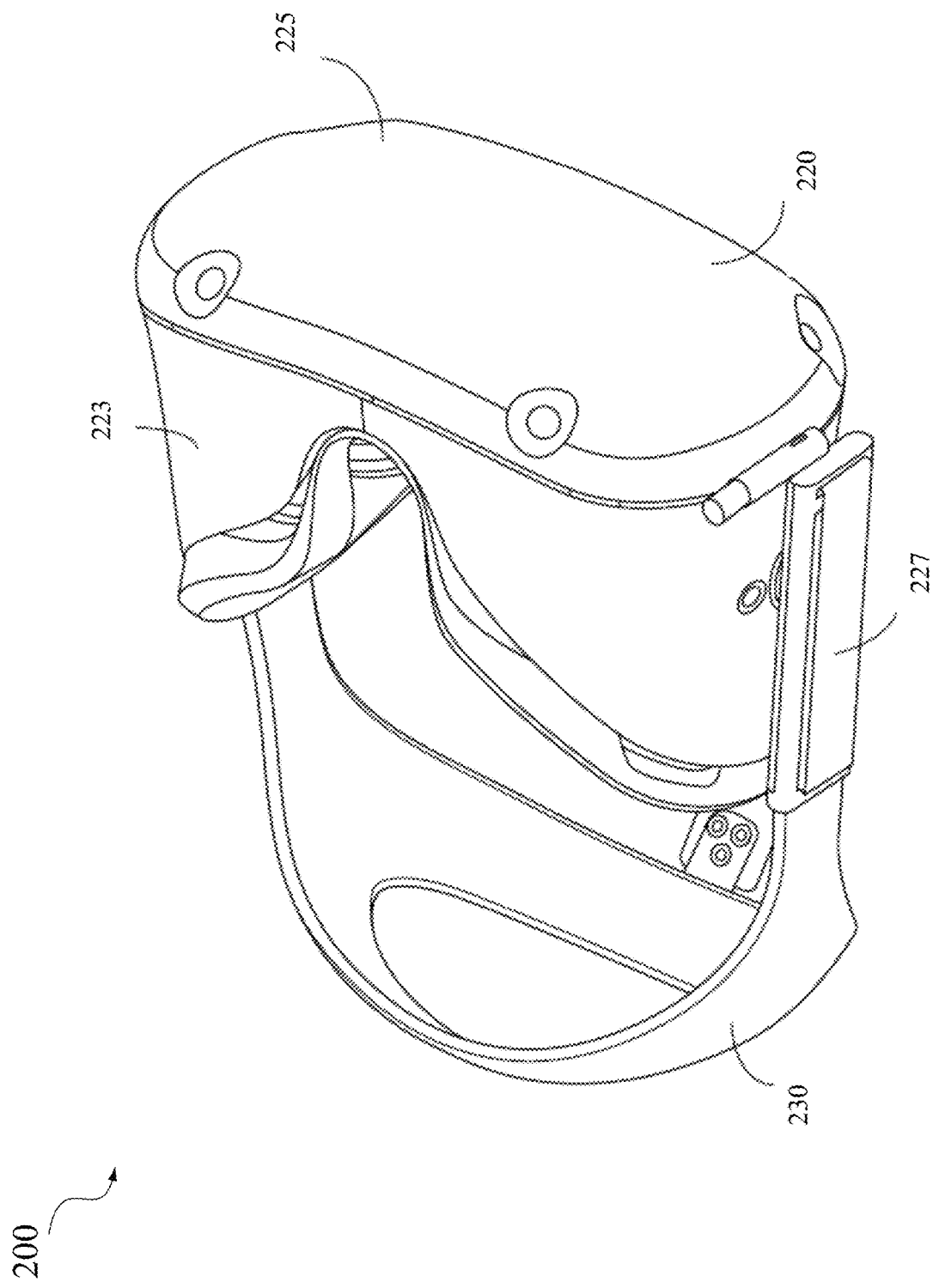
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a μLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
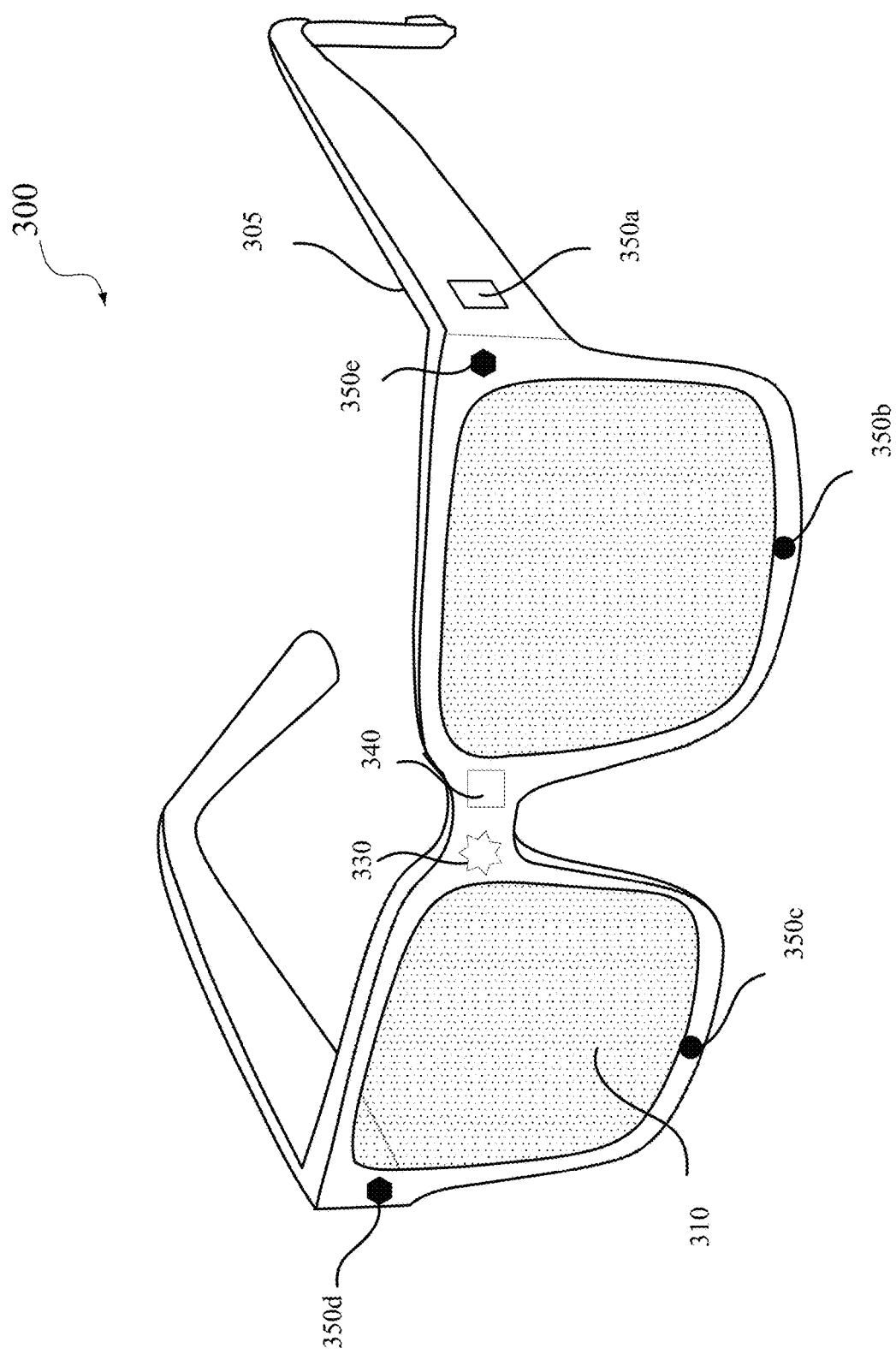
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 µm (e.g., about 1.2 µm) and the pitch may be less than 2 µm (e.g., about 1.5 µm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 µm) and thus light source 540 may not include sufficient light emitters for simultaneously generating a full display image.

For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
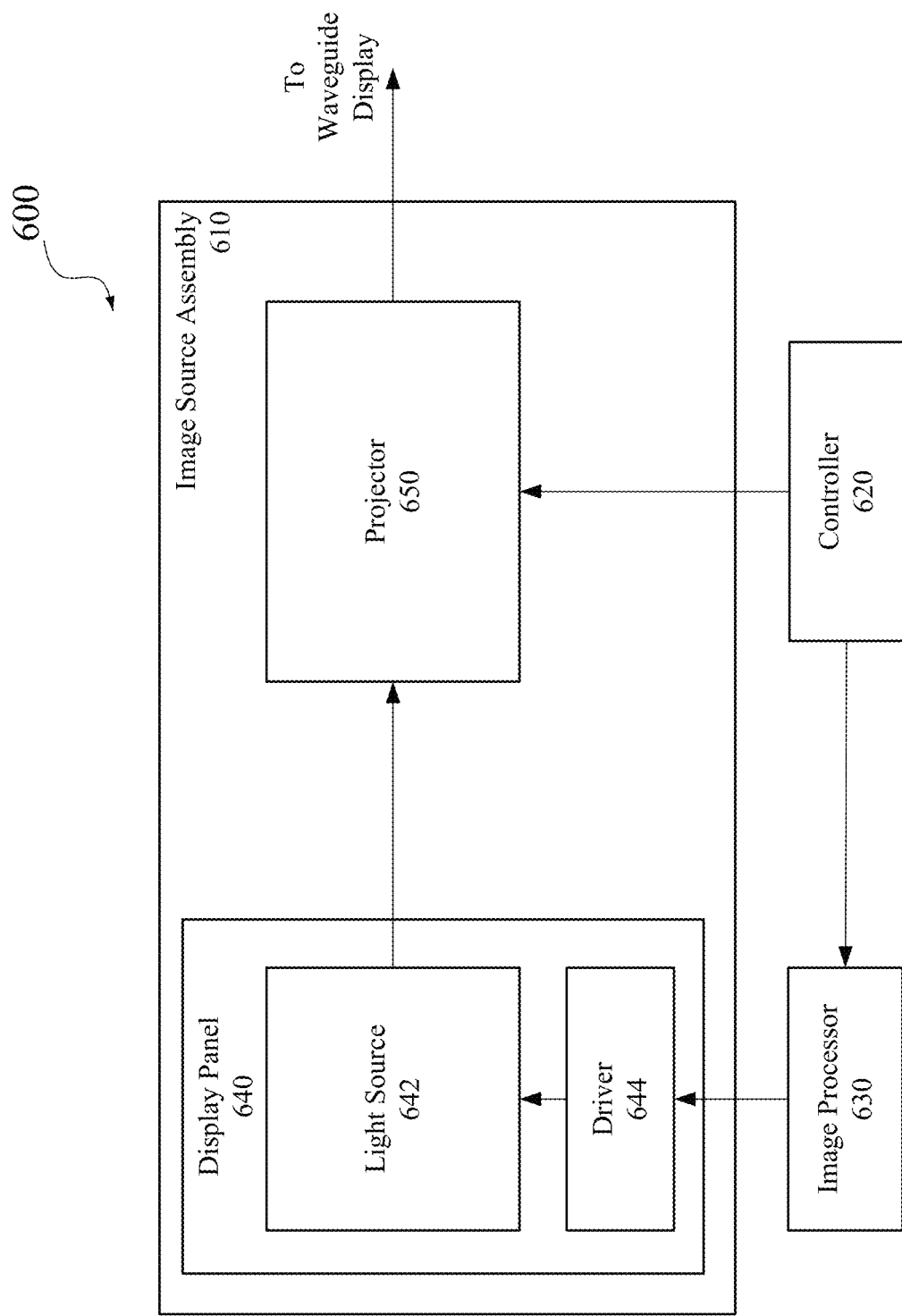
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a driver circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1.

The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and driver circuit 644, image processor 630 may be a sub-unit of controller 620 or driver circuit 644 in other embodiments. In other words, in those embodiments, controller 620 or driver circuit 644 may perform various image processing functions of image processor 630. Image processor 630 may also be referred to as an image processing circuit.

In the example shown in FIG. 6, light source 642 may be driven by driver circuit 644, based on data or instructions (e.g., display and scanning instructions) sent from controller 620 or image processor 630. In one embodiment, driver circuit 644 may include a circuit panel that connects to and mechanically holds various light emitters of light source 642. Light source 642 may emit light in accordance with one or more illumination parameters that are set by the controller 620 and potentially adjusted by image processor 630 and driver circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

In semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device.

The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. For LEDs, and in particular, micro-LEDs with reduced physical dimensions, improving the internal and external quantum efficiency and/or controlling the emission spectrum may be challenging. In some embodiments, to increase the light extraction efficiency, a mesa that includes at least some of the layers of semiconductor materials may be formed.

FIG. 7 illustrates an example of a chart 700 showing the luminance of light sources in a display panel as a function of the driving voltage and operating temperature. In this example, the light sources are OLEDs and the display panel is an AMOLED display. As shown in FIG. 7, the luminance from an OLED may increase as the temperature of the display panel increases from about 0° C. to about 35° C. For example, at a driving voltage of about 8 V, if the temperature of the display panel increases from about 25° C. to about 35° C., the maximum luminance of the display panel may increase from about 11,000 nit to about 13,100 nit, while the power consumption of the display panel remains unchanged (e.g., at about 690 mW). Similarly, at a driving voltage of about 7 V, if the temperature of the display panel increases from about 25° C. to about 35° C., the maximum luminance of the display panel may increase from about 7,600 nit to about 9,300 nit, while the power consumption of the display panel remains unchanged (e.g., at about 600 mW). Thus, if the temperature of the display panel can be maintained at, for example, about 35° C., the luminance may be increased with the same power consumption, or the power consumption can be reduced to achieve the same luminance. In addition, the OLEDs may have a longer life time if the operating temperature can be maintained within a certain temperature range.

FIGS. 8A-8I illustrate a series of images 800 showing the temperature change of an example of a display panel without thermal control as a function of time. FIGS. 8A-8I are thermal images of a display panel that were acquired at various times during the operation of the display panel. The thermal images of the display panel were acquired by a thermoviewer that was arranged at the back side of the display panel. In the illustrated example, the display panel was driven such that the temperature of the display panel continuously increased. In particular, the thermal image shown in FIG. 8A was acquired while the display panel was turned off and was kept at a temperature of about 22.1° C. The thermal image shown in FIG. 8B was acquired upon turning on the display panel, and the temperature at the center of the display panel was about 29.5° C. The thermal image shown in FIG. 8C was acquired about 0.5 minutes after turning on the display panel, and the temperature at the center of the display panel was about 32.3° C. The thermal image shown in FIG. 8D was acquired about 1.0 minute after turning on the display panel, and the temperature at the center of the display panel was about 34.1° C. The thermal image shown in FIG. 8E was acquired about 1.5 minutes after turning on the display panel, and the temperature at the center of the display panel was about 35.4° C. The thermal image shown in FIG. 8F was acquired about 2.0 minutes after turning on the display panel, and the temperature at the center of the display panel was about 36.4° C. The thermal image shown in FIG. 8G was acquired about 2.5 minutes after turning on the display panel, and the temperature at the center of the display panel was about 38.0° C. The thermal image shown in FIG. 8H was acquired about 3.0 minutes after turning on the display panel, and the temperature at the center of the display panel was about 39.2° C. The thermal image shown in FIG. 8I was acquired about 30.0 minutes after turning on the display panel, and the temperature at the center of the display panel was about 40.9° C. The images 800 show that the temperature is substantially uniform throughout the display panel at each time point.

Figure 9:
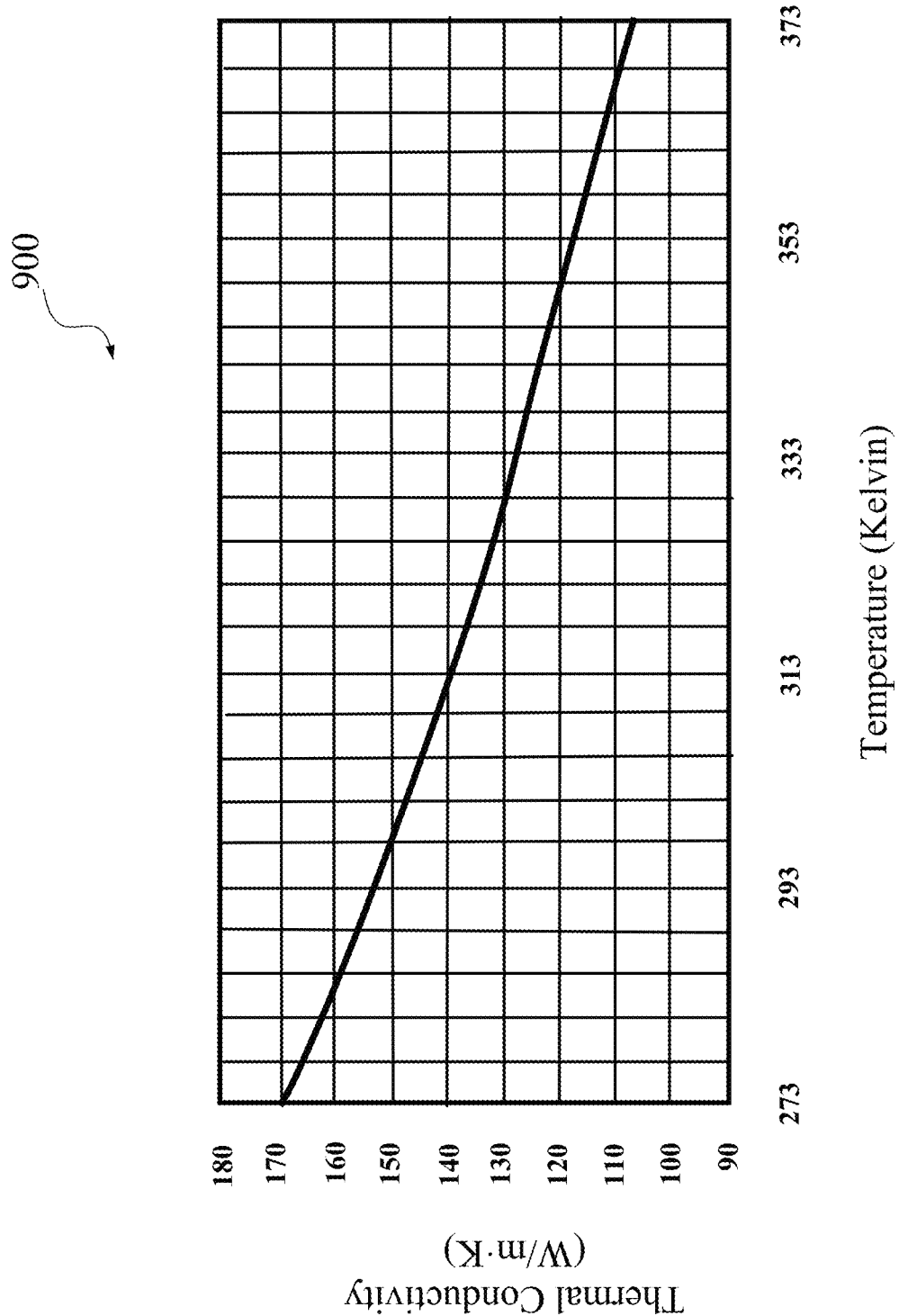
FIG. 9 includes an example of a chart showing the thermal conductivity of Si as a function of temperature.

FIG. 9 illustrates an example of a chart 900 showing the thermal conductivity of Si as a function of temperature. A display panel that includes micro-OLEDs, such as an AMOLED, may have a Si substrate. As shown in FIG. 9, Si has a high thermal conductivity between 273 K (0° C.) and 373 K (100° C.). For example, at 293 K (20° C.), Si has a thermal conductivity of approximately 155 W/m·K. In contrast, glass typically has a thermal conductivity of approximately 0.81 W/m·K. The high thermal conductivity of Si may cause the entire display panel to increase its temperature at approximately the same rate under driving conditions, as shown in FIGS. 8A-8I. The increase in temperature may be problematic for a display panel within an artificial reality system, because the increase in temperature may cause the luminance to increase, as discussed above with reference to FIG. 7. On the other hand, due to the high thermal conductivity of the silicon substrate, a small thermal control device may be coupled to the silicon substrate to control the temperature of the entire display panel.

The temperature of the display panel and the luminance may increase more significantly when a complicated application or content is being produced. Conversely, the temperature of the display panel and the luminance may decrease if there is a break in the display or if a simpler application or content is being produced. Such changes in the luminance, especially alternating increases and decreases in the luminance, may have a negative effect on the user experience, because the user is expecting to see a substantially constant luminance. The variation in the luminance and temperature may also reduce the life time of the light sources.

Figure 10B:
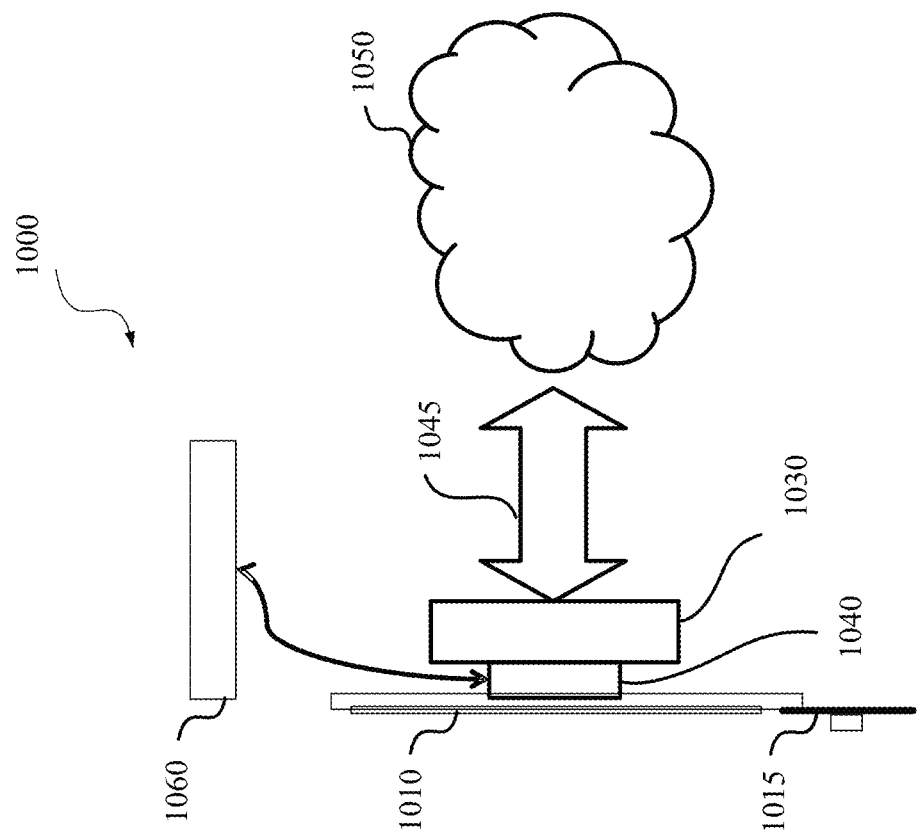
FIGS. 10A and 10B illustrate an example of a system for regulating the temperature of a display panel according to certain embodiments.
Figure 10A:
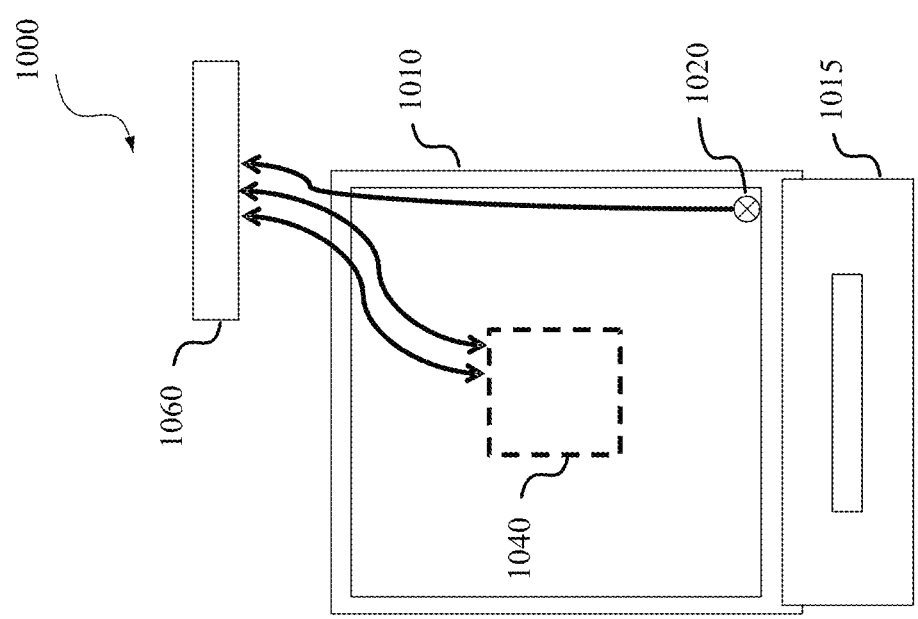

FIGS. 10A and 10B illustrate an example of a system 1000 for regulating the temperature of a display panel according to certain embodiments. FIG. 10A shows a top view of system 1000 and FIG. 10B shows a side view of system 1000. As shown in FIGS. 10A and 10B, system 1000 may include a display panel 1010 and a flexible printed circuit board (FPCB) 1015 for display module interconnection. In some examples, display panel 1010 may be an AMOLED, which may include a plurality of OLEDs or micro-OLEDs. In other examples, display panel 1010 may be an LCD, an OLED display, an ILED display, a μLED display, a TOLED, some other displays, or any combination thereof. Display panel 1010 may have a substrate that is made of, for example, Si or another material with a high thermal conductivity, such as a thermal conductivity above 100 W/m·K.

A temperature sensor 1020 may be embedded within the display panel 1010. Temperature sensor 1020 may be any type of sensors that can measure the temperature of display panel 1010, such as a negative temperature coefficient (NTC) thermistor, a resistance temperature detector (RTD), a thermocouple, or a semiconductor-based sensor. Temperature sensor 1020 may be a digital or analog temperature sensor. Because display panel 1010 has a substrate with a high thermal conductivity, a point measurement of the temperature by the temperature sensor 1020 may be representative of the temperature across the entire display panel 1010. Alternatively or in addition, the temperature of display panel 1010 may be measured by a remote sensor, such as a thermopile infrared (IR) sensor.

A thermoelectric heater/cooler device 1040 may be arranged on or near a back surface of the substrate of display panel 1010. Thermoelectric heater/cooler device 1040 may be a single thermoelectric component that provides both heating and cooling, or may include a separate heater and cooler. For example, the separate heater may be a resistive heating element, and the separate cooler may be a thermoelectric cooler that operates according to the thermoelectric effect (e.g., Peltier effect). The heater may be configured to provide heat to display panel 1010, while the cooler may be configured to remove heat from display panel 1010. In one example, thermoelectric heater/cooler device 1040 may be a thermoelectric heat pump, such as a Peltier heat pump, which may include a solid-state active heat pump that consumes electrical energy to transfer heat from one side of the device to the other, depending on the direction of the supplied DC current. Thus, the thermoelectric heat pump can be used as a temperature controller or regulator to either transfer heat to or from display panel 1010 based on the direction of the supplied DC current. Thermoelectric heater/cooler device 1040 may achieve a temperature difference of, for example, up to 70° C.

A heat sink 1030 may be used to transfer heat between display panel 1010 and ambient air 1050 via a bidirectional heat flow 1045, to dissipate (e.g., radiate) heat to ambient air 1050 or collect heat from ambient air 1050. For example, thermoelectric heater/cooler device 1040 may be used as a heater to transfer heat from the side of thermoelectric heater/cooler device 1040 closer to heat sink 1030 (or a resistive heating device) to the side of thermoelectric heater/cooler device 1040 closer to display panel 1010, where heat collected by heat sink from ambient air 1050 may be transferred to display panel 1010. Thermoelectric heater/cooler device 1040 may also be used as a cooler to transfer heat from the side of thermoelectric heater/cooler device 1040 closer to display panel 1010 to the side of thermoelectric heater/cooler device 1040 closer to heat sink 1030, which may dissipate (e.g., radiate) the heat from display panel 1010 to ambient air 1050.

A controller 1060 may be configured to receive a first signal from the temperature sensor 1020. The first signal may include the measured temperature of display panel 1010. Controller 1060 may be configured to send a second signal to thermoelectric heater/cooler device 1040 (or separate signals to the cooler and the heater). For example, based on the measured temperature by temperature sensor 1020, controller 1060 may either apply a DC current in a first direction to thermoelectric heater/cooler device 1040 to transfer heat from display panel 1010 to heat sink 1030 and cool down display panel 1010, or may apply a DC current in an opposite direction to thermoelectric heater/cooler device 1040 to transfer heat from heat sink 1030 to display panel 1010 and increase the temperature of display panel 1010. The amplitude of the DC current may be determined based on the measured temperature and the desired temperature, the amount of heat to be transferred, and/or the desired time to achieve the desired temperature.

In some embodiments, the second signal may include instructions for the cooler to remove heat from display panel 1010 directly or through a heat pump, or instructions for the heater to provide heat to display panel 1010 directly or through the heat pump. In some examples, the instructions may indicate the amount of heat to be removed or provided. In some examples, the instructions may indicate the amplitude and direction of the current applied to the heat pump. In other examples, the instructions may indicate a length of time for the cooler or heater to operate. As discussed in further detail below, the instructions may be determined by comparing the measured temperature of display panel 1010 with a target temperature. The target temperature may be determined by referring to chart 700 shown in FIG. 7. For example, if display panel 1010 is being driven at a driving voltage of 8 V and the target luminance is 13,000 nit, the target temperature may be determined to be 35° C. Alternatively or in addition, the target temperature may be determined as a function of a variety of variables, such as the power consumption of display panel 1010 at the target temperature or the efficiency achieved by display panel 1010 at the target temperature.

Figure 11:
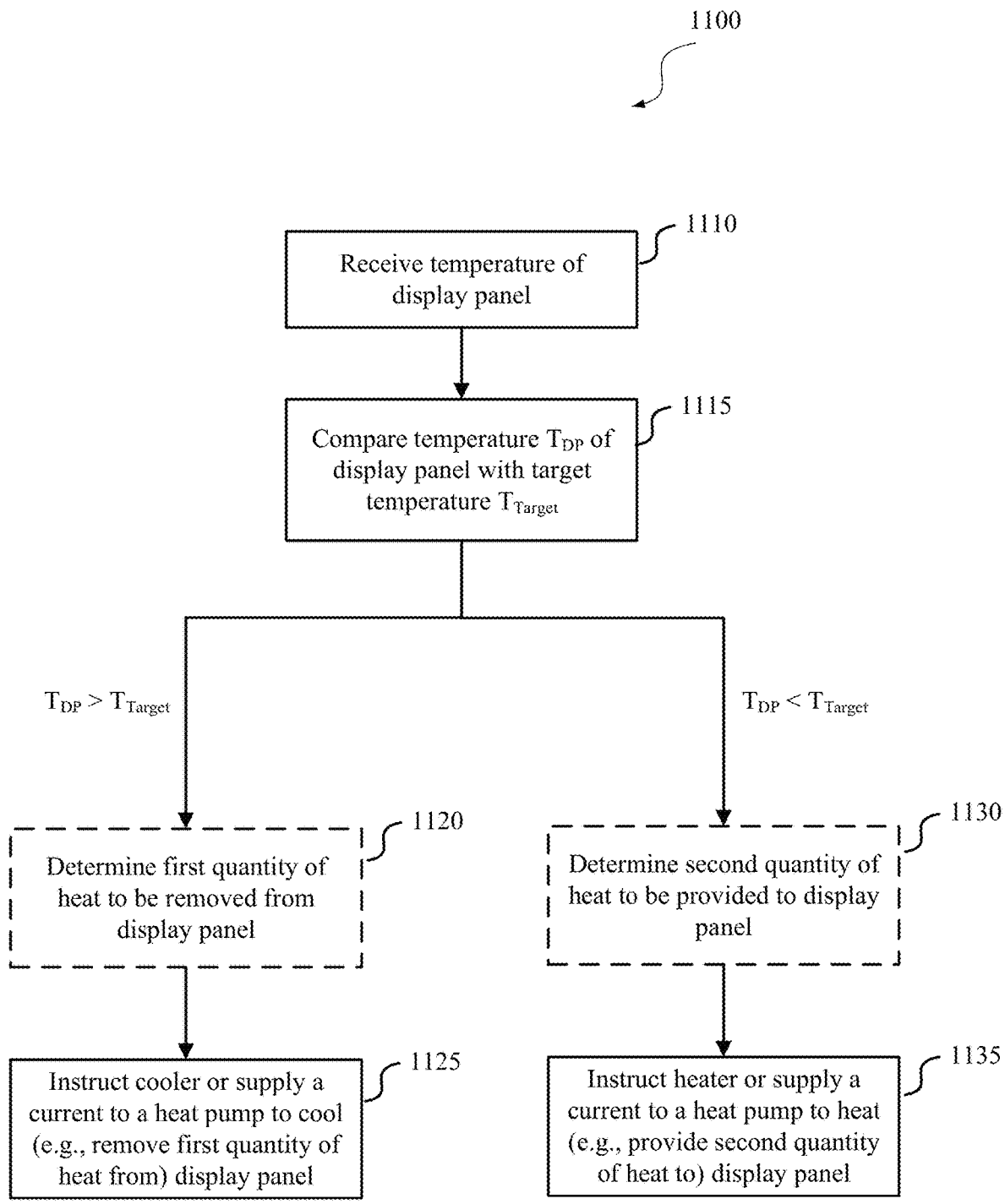
FIG. 11 is a simplified flowchart illustrating an example of a method for regulating the temperature of a display panel according to certain embodiments.

FIG. 11 is a simplified flowchart 1100 illustrating an example of a method for regulating the temperature of a display panel according to certain embodiments. The operations in flowchart 1100 may be performed by, for example, controller 1060 shown in FIGS. 10A and 10B. The method may be used to maintain the temperature of display panel 1010 at or near the target temperature. For example, the temperature of the display panel 1010 may be maintained within ±0.1%, ±0.5%, ±1.0%, ±5.0%, or ±10.0% of the target temperature. In one example, the temperature of display panel 1010 may be maintained between about 35° C. and about 40° C. The operations in flowchart 1100 may be performed continually and/or at predetermined time intervals during operation of display panel 1010.

At block 1110, a temperature controller (e.g., controller 1060) may receive a first signal including a measured temperature of a display panel (e.g., display panel 1010). The first signal may be received from, for example, temperature sensor 1020 or another sensor that is configured to measure the temperature of display panel 1010. The temperature of display panel 1010 may be measured at one or more locations of display panel 1010 at various time intervals, such as every 1 second, every 5 seconds, every 10 seconds, every 30 seconds, every 1 minute, every 5 minutes, or every 30 minutes.

At block 1115, the temperature controller may compare the measured temperature of the display panel 1010 with a target temperature or a target temperature range. If the measured temperature of display panel 1010 is greater than the target temperature or greater than the upper threshold temperature of the target temperature range, the temperature controller may be triggered to optionally determine a first quantity of heat to be removed from display panel 1010 at block 1120.

Optionally, at block 1120, the temperature controller may determine the first quantity of heat to be removed from display panel 1010 based on the difference between the measured temperature of the display panel 1010 and the target temperature. Alternatively or additionally, the first quantity of heat to be removed from the display panel may be determined as a function of various characteristics of display panel 1010, such as the heat capacity of display panel 1010 and/or the thermal conductivity of display panel 1010. In other examples, the first quantity of heat to be removed from display panel 1010 may be a predetermined quantity of heat, such that block 1120 is not performed. The predetermined quantity of heat may be an incremental amount of heat that can be removed repeatedly until the measured temperature of display panel 1010 reaches the target temperature. In some examples, the first quantity of heat may not be determined or used. Instead, a feedback loop, such as a proportional integral derivative (PID) control loop, may be used to dynamically control a cooler or a heat pump (e.g., thermoelectric heater/cooler device 1040) to cool down display panel 1010 based on the updated temperature measured by the temperature sensor.

At block 1125, the temperature controller may instruct or otherwise control the cooler or the heat pump to remove heat from display panel 1010 as described above. For example, the temperature controller may determine the direction and amplitude of a drive current I to be supplied to the heat pump based on the first quantity of heat (Q), the Peltier coefficient (P), and the operation time (t) according to $Q = P \times I \times t$, and supply the determined current I to the heat pump. In some embodiments, the temperature controller may use a PID control loop to dynamically control the cooler or the heat pump (e.g., by dynamically adjusting drive current I) to cool down display panel 1010, based on feedback (e.g., measured temperature from the temperature sensor).

At block 1115, if the measured temperature of display panel 1010 is lower than the target temperature or the lower threshold temperature of the target temperature range, the temperature controller may be triggered to optionally determine a second quantity of heat to be provided to display panel 1010 at block 1130. The second quantity of heat to be provided to display panel 1010 may be determined as a function of the difference between the measured temperature of display panel 1010 and the target temperature. Alternatively or in addition, the second quantity of heat to be provided to the display panel may be determined as a function of various characteristics of display panel 1010, such as the heat capacity of display panel 1010 and/or the thermal conductivity of display panel 1010. In other examples, the second quantity of heat to be provided to display panel 1010 may be a predetermined quantity of heat, such that block 1130 is not performed. The predetermined quantity of heat may be an incremental amount of heat that can be provided repeatedly until the measured temperature of display panel 1010 reaches the target temperature. In some examples, the second quantity of heat may not be determined or used. Instead, a PID control loop may be used to dynamically control a heater or a heat pump (e.g., thermoelectric heater/cooler device 1040) to increase the temperature of display panel 1010 based on the updated temperature measured by the temperature sensor.

At block 1135, the temperature controller may instruct or otherwise control the heater or the heat pump to provide heat to display panel 1010 as described above. For example, the temperature controller may determine the amplitude and direction of a drive current I to be supplied to the heat pump based on the second quantity of heat (Q), the Peltier coefficient (P), and the operation time (t) according to $Q = P \times I \times t$, and supply the determined current I to the heat pump to provide heat to display panel 1010. In some embodiments, the temperature controller may use a PID control loop to dynamically control the heater or the heat pump (e.g., by dynamically adjusting drive current I) to increase the temperature of display panel 1010, based on feedback (e.g., measured temperature from the temperature sensor).

Figure 12:
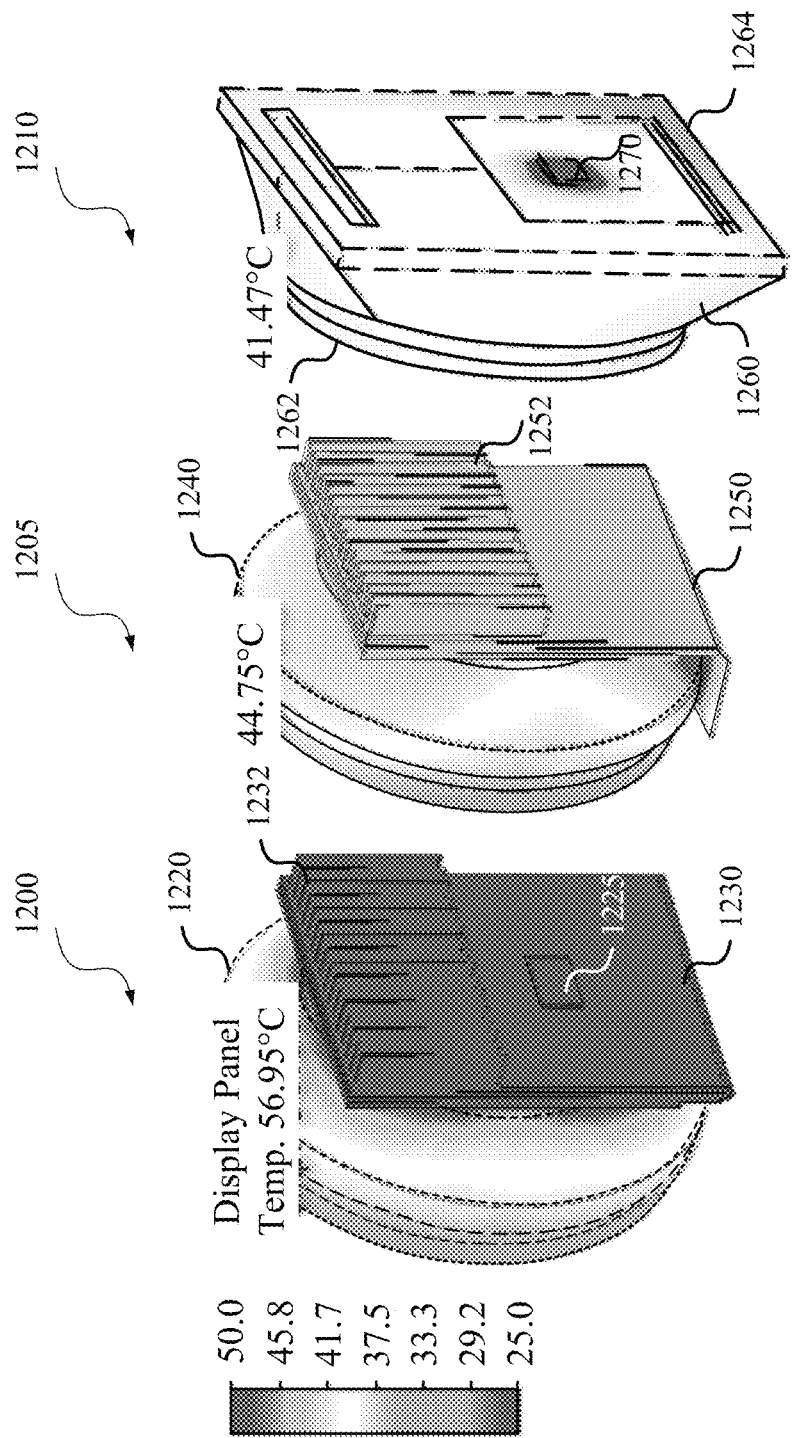
FIG. 12A illustrates simulated temperature distribution of a portion of an example of a system for regulating the temperature of a display panel according to certain embodiments.
FIG. 12B illustrates simulated temperature distribution of a portion of an example of a system for regulating the temperature of a display panel according to certain embodiments.
FIG. 12C illustrates simulated temperature distribution of a portion of an example of a system for regulating the temperature of a display panel according to certain embodiments.

FIG. 12A illustrates simulated temperature distribution of a portion of an example of a system 1200 for regulating the temperature of a display panel according to certain embodiments. As shown in FIG. 12A, system 1200 may include a heat sink 1230, an eye cup 1220, and a display module. The display module is not shown in FIG. 12A because heat sink 1230 may block the view of the display module. Eye cup 1220 may include a thermal insulation material, such as plastic, foam, rubber material, or some combination thereof, to minimize the heat transfer from the display panel to the user. The display module may include a heating/cooling device 1225 (e.g., thermoelectric heater/cooler device 1040) attached to the display panel and heat sink 1230. Heating/cooling device 1225 may be used to transfer heat between the display panel and heat sink 1230. Heat sink 1230 may include fins 1232. In the example illustrated in FIG. 12A, system 1200 may not include a directional blower (e.g., a fan), and the temperature of the display panel may be about 56.95° C.

FIG. 12B illustrates simulated temperature distribution of a portion of an example of a system 1205 for regulating the temperature of a display panel according to certain embodiments. System 1205 may include a heat sink 1250, an eye cup 1240, and a display module. The display module is not shown in FIG. 12B because heat sink 1250 blocks the view of the display module. Eye cup 1240 may include a thermal insulation material, such as plastic, foam, rubber material, or some combination thereof, to minimize the heat transfer from the display panel to the user. The display module may include a heating/cooling device (e.g., thermoelectric heater/cooler device 1040, not shown in FIG. 12B) attached to the display panel and heat sink 1250. Heating/cooling device 1225 may be used to transfer heat between the display panel and heat sink 1250. Heat sink 1250 may include fins 1252. In the example illustrated in FIG. 12B, the display driver integrated circuit (DDIC) of the display module may be isolated from the display panel, a directional blower is used to remove heat from the display panel, and the temperature of the display panel may be about 44.75° C.

FIG. 12C illustrates simulated temperature distribution of a portion of an example of a system 1210 for regulating the temperature of a display panel according to certain embodiments. System 1210 may include an eye cup 1260 and a display module (not shown) within eye cup 1260. Eye cup 1260 may include a front portion 1262 that includes a thermal insulation material, such as plastic, foam, rubber material, or some combination thereof, to minimize the heat transfer from the display panel to the user. Eye cup 1260 may also include a back portion 1264 coupled to the display module, for example, through a heating/cooling device 1270 (e.g., thermoelectric heater/cooler device 1040). Heating/cooling device 1270 may be used to transfer heat between the display panel and back portion 1264 of eye cup 1260. Back portion 1264 of eye cup 1260 may include a thermally conductive material (e.g., aluminum alloy or magnesium alloy) to maximize the heat transfer between the display panel and ambient air. In the example illustrated in FIG. 12C, back portion 1264 of eye cup 1260 may include aluminum and the temperature of the display panel may be about 41.47° C.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 13:
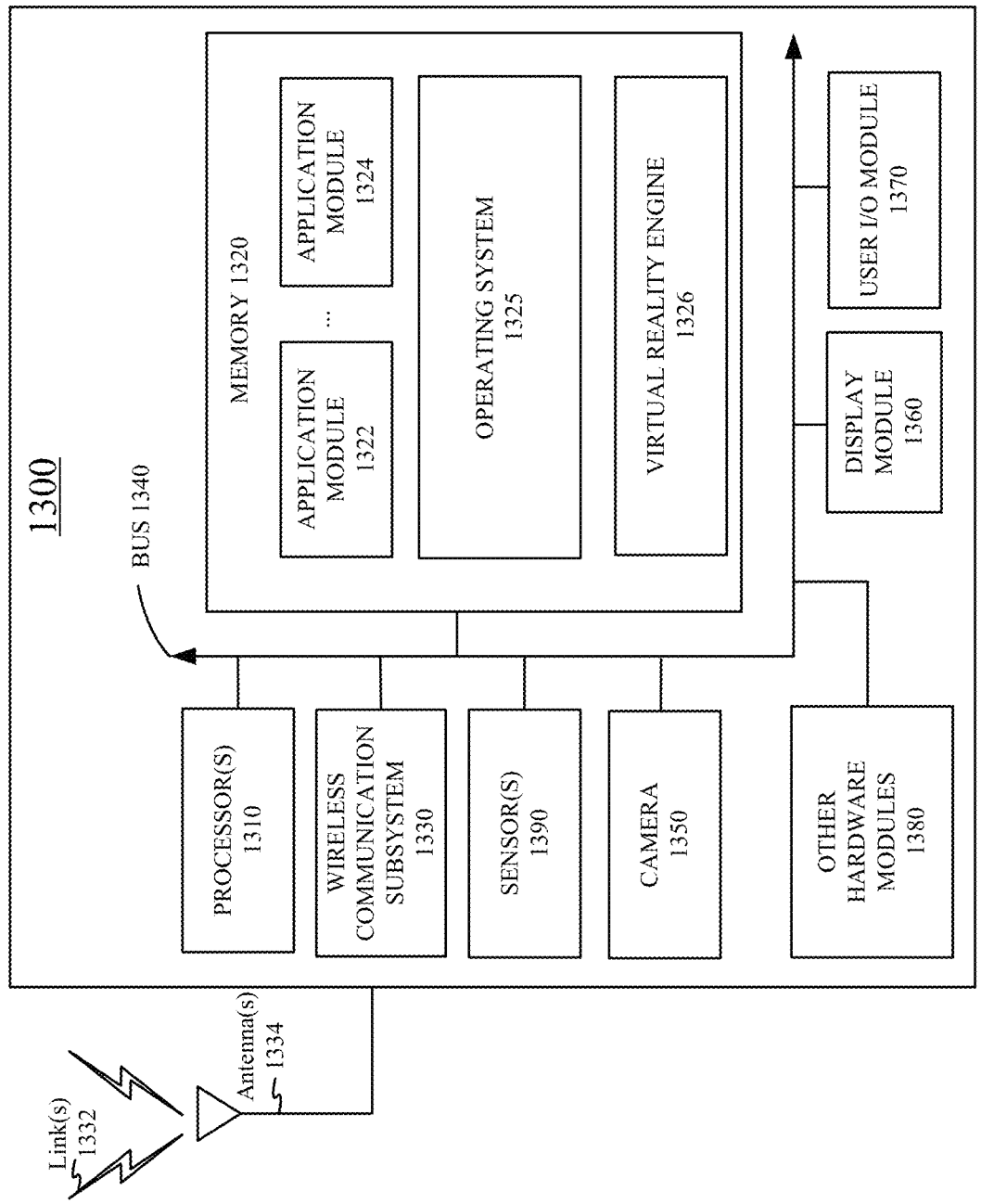
FIG. 13 is a simplified block diagram of an electronic system of an example of a near-eye display according to certain embodiments.

FIG. 13 is a simplified block diagram of an example electronic system 1300 of an example near-eye display (e.g., HMD device) for implementing some of the examples disclosed herein. Electronic system 1300 may be used as the electronic system of an HMD device or other near-eye displays described above. In this example, electronic system 1300 may include one or more processor(s) 1310 and a memory 1320. Processor(s) 1310 may be configured to execute instructions for performing operations at a number of components, and can be, for example, a general-purpose processor or microprocessor suitable for implementation within a portable electronic device. Processor(s) 1310 may be communicatively coupled with a plurality of components within electronic system 1300. To realize this communicative coupling, processor(s) 1310 may communicate with the other illustrated components across a bus 1340. Bus 1340 may be any subsystem adapted to transfer data within electronic system 1300. Bus 1340 may include a plurality of computer buses and additional circuitry to transfer data.

Memory 1320 may be coupled to processor(s) 1310. In some embodiments, memory 1320 may offer both short-term and long-term storage and may be divided into several units. Memory 1320 may be volatile, such as static random access memory (SRAM) and/or dynamic random access memory (DRAM) and/or non-volatile, such as read-only memory (ROM), flash memory, and the like. Furthermore, memory 1320 may include removable storage devices, such as secure digital (SD) cards. Memory 1320 may provide storage of computer-readable instructions, data structures, program modules, and other data for electronic system 1300. In some embodiments, memory 1320 may be distributed into different hardware modules. A set of instructions and/or code might be stored on memory 1320. The instructions might take the form of executable code that may be executable by electronic system 1300, and/or might take the form of source and/or installable code, which, upon compilation and/or installation on electronic system 1300 (e.g., using any of a variety of generally available compilers, installation programs, compression/decompression utilities, etc.), may take the form of executable code.

In some embodiments, memory 1320 may store a plurality of application modules 1322 through 1324, which may include any number of applications. Examples of applications may include gaming applications, conferencing applications, video playback applications, or other suitable applications. The applications may include a depth sensing function or eye tracking function. Application modules 1322-1324 may include particular instructions to be executed by processor(s) 1310. In some embodiments, certain applications or parts of application modules 1322-1324 may be executable by other hardware modules 1380. In certain embodiments, memory 1320 may additionally include secure memory, which may include additional security controls to prevent copying or other unauthorized access to secure information.

In some embodiments, memory 1320 may include an operating system 1325 loaded therein. Operating system 1325 may be operable to initiate the execution of the instructions provided by application modules 1322-1324 and/or manage other hardware modules 1380 as well as interfaces with a wireless communication subsystem 1330 which may include one or more wireless transceivers. Operating system 1325 may be adapted to perform other operations across the components of electronic system 1300 including threading, resource management, data storage control and other similar functionality.

Wireless communication subsystem 1330 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 1300 may include one or more antennas 1334 for wireless communication as part of wireless communication subsystem 1330 or as a separate component coupled to any portion of the system. Depending on desired functionality, wireless communication subsystem 1330 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 1330 may permit data to be exchanged with a network, other computer systems, and/or any other devices described herein. Wireless communication subsystem 1330 may include a means for transmitting or receiving data, such as identifiers of HMD devices, position data, a geographic map, a heat map, photos, or videos, using antenna(s) 1334 and wireless link(s) 1332. Wireless communication subsystem 1330, processor(s) 1310, and memory 1320 may together comprise at least a part of one or more of a means for performing some functions disclosed herein.

Embodiments of electronic system 1300 may also include one or more sensors 1390. Sensor(s) 1390 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 1390 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 1300 may include a display module 1360. Display module 1360 may be a near-eye display, and may graphically present information, such as images, videos, and various instructions, from electronic system 1300 to a user. Such information may be derived from one or more application modules 1322-1324, virtual reality engine 1326, one or more other hardware modules 1380, a combination thereof, or any other suitable means for resolving graphical content for the user (e.g., by operating system 1325). Display module 1360 may use LCD technology, LED technology (including, for example, OLED, ILED, µ-LED, AMOLED, TOLED, etc.), light emitting polymer display (LPD) technology, or some other display technology.

Electronic system 1300 may include a user input/output module 1370. User input/output module 1370 may allow a user to send action requests to electronic system 1300. An action request may be a request to perform a particular action. For example, an action request may be to start or end an application or to perform a particular action within the application. User input/output module 1370 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1300. In some embodiments, user input/output module 1370 may provide haptic feedback to the user in accordance with instructions received from electronic system 1300. For example, the haptic feedback may be provided when an action request is received or has been performed.

Electronic system 1300 may include a camera 1350 that may be used to take photos or videos of a user, for example, for tracking the user's eye position. Camera 1350 may also be used to take photos or videos of the environment, for example, for VR, AR, or MR applications. Camera 1350 may include, for example, a complementary metal-oxide-semiconductor (CMOS) image sensor with a few millions or tens of millions of pixels. In some implementations, camera 1350 may include two or more cameras that may be used to capture 3-D images.

In some embodiments, electronic system 1300 may include a plurality of other hardware modules 1380. Each of other hardware modules 1380 may be a physical module within electronic system 1300. While each of other hardware modules 1380 may be permanently configured as a structure, some of other hardware modules 1380 may be temporarily configured to perform specific functions or temporarily activated. Examples of other hardware modules 1380 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 1380 may be implemented in software.

In some embodiments, memory 1320 of electronic system 1300 may also store a virtual reality engine 1326. Virtual reality engine 1326 may execute applications within electronic system 1300 and receive position information, acceleration information, velocity information, predicted future positions, or any combination thereof of the HMD device from the various sensors. In some embodiments, the information received by virtual reality engine 1326 may be used for producing a signal (e.g., display instructions) to display module 1360. For example, if the received information indicates that the user has looked to the left, virtual reality engine 1326 may generate content for the HMD device that mirrors the user's movement in a virtual environment. Additionally, virtual reality engine 1326 may perform an action within an application in response to an action request received from user input/output module 1370 and provide feedback to the user. The provided feedback may be visual, audible, or haptic feedback. In some implementations, processor(s) 1310 may include one or more GPUs that may execute virtual reality engine 1326.

In various implementations, the above-described hardware and modules may be implemented on a single device or on multiple devices that can communicate with one another using wired or wireless connections. For example, in some implementations, some components or modules, such as GPUs, virtual reality engine 1326, and applications (e.g., tracking application), may be implemented on a console separate from the head-mounted display device. In some implementations, one console may be connected to or support more than one HMD.

In alternative configurations, different and/or additional components may be included in electronic system 1300. Similarly, functionality of one or more of the components can be distributed among the components in a manner different from the manner described above. For example, in some embodiments, electronic system 1300 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A system comprising:
    a display panel;
    display optics configured to project images generated by the display panel to a user's eye;
    a temperature sensor configured to measure a temperature of the display panel;
    a thermoelectric device coupled to a backside of the display panel and configured to transfer heat to or from the display panel; and
    a controller electrically coupled to the temperature sensor and the thermoelectric device, the controller configured to:
        receive a first signal comprising the temperature of the display panel measured by the temperature sensor;
        compare the temperature of the display panel with a target temperature;
        send, upon determining that the temperature of the display panel is greater than the target temperature, a second signal to the thermoelectric device, wherein the second signal causes the thermoelectric device to remove a first quantity of heat from the display panel; and
        send, upon determining that the temperature of the display panel is lower than the target temperature, a third signal to the thermoelectric device, wherein the third signal causes the thermoelectric device to provide a second quantity of heat to the display panel to increase the temperature of the display panel.

2. The system of claim 1, wherein the thermoelectric device includes a Peltier heat pump.

3. The system of claim 2, wherein the second signal and the third signal are direct current signals having opposite current flow directions.

4. The system of claim 1, wherein the thermoelectric device includes a heater and a cooler.

5. The system of claim 1, further comprising a heat sink coupled to the thermoelectric device, the heat sink including a thermal conductive material and configured to dissipate heat to or absorb heat from ambient air.

6. The system of claim 5, wherein the heat sink is a back portion of an eye cup.

7. The system of claim 1, wherein the controller is further configured to:
    upon determining that the temperature of the display panel is greater than the target temperature, determine the first quantity of heat based on a first difference between the temperature of the display panel and the target temperature; and
    upon determining that the temperature of the display panel is lower than the target temperature, determine the second quantity of heat based on a second difference between the temperature of the display panel and the target temperature.

8. The system of claim 1, wherein the controller is configured to maintain the temperature of the display panel within ±5% of the target temperature in a proportional integral derivative (PID) control loop.

9. The system of claim 1, wherein the temperature sensor is embedded within the display panel.

10. The system of claim 1, wherein the display panel comprises a silicon substrate.

11. The system of claim 10, wherein the thermoelectric device is characterized by an area that is a fraction of an area of the display panel.

12. The system of claim 1, wherein the display panel comprises a plurality of organic light emitting diodes (OLEDs).

13. The system of claim 1, wherein the display panel includes an active matrix organic light emitting diode (AMOLED) display.

14. The system of claim 1, wherein the target temperature includes a range of temperatures.

15. A method comprising:
receiving a first signal comprising a measured temperature of a display panel behind display optics of a near-eye display system;
comparing the measured temperature of the display panel with a target temperature; and
controlling a thermoelectric device coupled to the display panel, the controlling comprising:
sending, upon determining that the measured temperature of the display panel is greater than the target temperature, a second signal to the thermoelectric device to cause the thermoelectric device to remove a first quantity of heat from the display panel; and
sending, upon determining that the measured temperature of the display panel is lower than the target temperature, a third signal to the thermoelectric device to cause the thermoelectric device to provide a second quantity of heat to the display panel to heat the display panel.

16. The method of claim 15, further comprising:
upon determining that the measured temperature of the display panel is greater than the target temperature, determining the first quantity of heat based on a first difference between the measured temperature of the display panel and the target temperature; and
upon determining that the measured temperature of the display panel is lower than the target temperature, determining the second quantity of heat based on a second difference between the measured temperature of the display panel and the target temperature.

17. The method of claim 15, further comprising repeatedly performing the receiving, the comparing, and the controlling in a proportional integral derivative (PID) control loop to maintain the measured temperature of the display panel within ±5% of the target temperature.

18. The method of claim 15, wherein the measured temperature of the display panel is determined by a temperature sensor embedded within the display panel.

19. The method of claim 15, wherein:
the thermoelectric device includes a Peltier heat pump; and
the second signal and the third signal are direct current signals having opposite current flow directions.

20. A computer-program product tangibly embodied in a non-transitory machine-readable storage medium, the computer-program product including instructions configured to cause one or more processors to perform operations comprising:
receiving a first signal comprising a measured temperature of a display panel behind display optics of a near-eye display system;
comparing the measured temperature of the display panel with a target temperature; and
controlling a thermoelectric device coupled to the display panel, the controlling comprising:
sending, upon determining that the measured temperature of the display panel is greater than the target temperature, a second signal to the thermoelectric device to cause the thermoelectric device to remove a first quantity of heat from the display panel; and
sending, upon determining that the measured temperature of the display panel is lower than the target temperature, a third signal to the thermoelectric device to cause the thermoelectric device to provide a second quantity of heat to the display panel to heat the display panel.

* * * * *